(12) United States Patent
Massolini et al.

(10) Patent No.: US 11,094,449 B2
(45) Date of Patent: Aug. 17, 2021

(54) METHODS AND APPARATUS FOR ISOLATION BARRIER WITH INTEGRATED MAGNETICS FOR HIGH POWER MODULES

(71) Applicant: TEXAS INSTRUMENTS INCORPORATED, Dallas, TX (US)

(72) Inventors: Roberto Giampiero Massolini, Pavia (IT); Vijaylaxmi Khanolkar, Pune (IN); Joyce Mullenix, San Jose, CA (US); Rais Miftakhutdinov, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/700,739

(22) Filed: Dec. 2, 2019

(65) Prior Publication Data

US 2020/0105458 A1  Apr. 2, 2020

Related U.S. Application Data

(63) Continuation of application No. 14/974,901, filed on Dec. 18, 2015, now Pat. No. 10,497,506.

(51) Int. Cl.
*H01F 27/28* (2006.01)
*H01F 27/24* (2006.01)
(Continued)

(52) U.S. Cl.
CPC ............ *H01F 27/2804* (2013.01); *B22F 3/10* (2013.01); *B22F 5/12* (2013.01); *B22F 7/06* (2013.01);
(Continued)

(58) Field of Classification Search
CPC .................... H01F 27/2804; H01F 2027/2809
See application file for complete search history.

(56) References Cited

U.S. PATENT DOCUMENTS 5,312,674 A * 5/1994 Haertling .............. H01L 23/055
  252/62
5,420,558 A * 5/1995 Ito ...................... H01F 17/0006
  336/200
(Continued)

FOREIGN PATENT DOCUMENTS

CN  103187393 A  7/2013

OTHER PUBLICATIONS

M. Acanski, J. Popovic-Gerber, B. Ferreira, "Design of a Flexible Very Low Profile High Step-Up PV Module Integrated Converter." 2012 IEEE Energy Conversion Congress and Exposition, pp. 2942-2948.

(Continued)

*Primary Examiner* — Elvin G Enad
*Assistant Examiner* — Malcolm Barnes
(74) *Attorney, Agent, or Firm* — Valerie M. Davis; Charles A. Brill; Frank D. Cimino

(57) ABSTRACT

For isolation barrier with magnetics, an apparatus includes an isolation laminate including a dielectric core having a first surface and a second surface opposed to the first surface; at least one conductive layer configured as a first transformer coil overlying the first surface; a first dielectric layer surrounding the at least one conductive layer; a first magnetic layer overlying the at least one conductive layer; at least one additional conductive layer configured as a second transformer coil overlying the second surface; a second dielectric layer surrounding the at least one additional conductive layer; and a second magnetic layer overlying the at least one additional conductive layer. Methods for forming the isolation barriers and additional apparatus arrangements are also described.

20 Claims, 8 Drawing Sheets

(51) Int. Cl.
*H01F 41/04* (2006.01)
*B22F 7/06* (2006.01)
*B22F 3/10* (2006.01)
*B22F 5/12* (2006.01)
*H01F 41/02* (2006.01)

(52) U.S. Cl.
CPC ........... *H01F 27/24* (2013.01); *H01F 27/288* (2013.01); *H01F 41/0206* (2013.01); *H01F 41/04* (2013.01); *H01F 41/046* (2013.01); *B22F 2999/00* (2013.01); *C22C 2202/02* (2013.01); *H01F 2027/2809* (2013.01); *H01F 2027/2819* (2013.01); *H01L 2224/48137* (2013.01); *H01L 2224/48247* (2013.01); *H01L 2924/181* (2013.01)

(56) References Cited

U.S. PATENT DOCUMENTS

| | | | | |
|---|---|---|---|---|
| 2003/0020583 | A1* | 1/2003 | Hui | H01F 27/2804 336/200 |
| 2005/0128038 | A1* | 6/2005 | Hyvonen | H01L 23/5227 336/182 |
| 2007/0247268 | A1* | 10/2007 | Oya | H01L 23/3128 336/200 |
| 2008/0278275 | A1 | 11/2008 | Fouquet et al. | |
| 2009/0243782 | A1* | 10/2009 | Fouquet | H04L 25/0266 336/200 |
| 2010/0148911 | A1* | 6/2010 | Fouquet | H01F 27/2804 336/200 |
| 2010/0259909 | A1* | 10/2010 | Ho | H01F 27/2804 361/767 |
| 2010/0265030 | A1* | 10/2010 | Weekamp | H01F 27/29 336/232 |
| 2011/0057291 | A1* | 3/2011 | Slupsky | H04B 5/0081 257/531 |
| 2011/0095620 | A1* | 4/2011 | Fouquet | H03F 3/45475 307/104 |
| 2012/0020419 | A1* | 1/2012 | Kaeriyama | H04L 25/4902 375/259 |
| 2012/0168901 | A1* | 7/2012 | Santangelo | H01L 23/645 257/531 |
| 2012/0236528 | A1* | 9/2012 | Le | H05K 9/0088 361/818 |
| 2013/0043970 | A1* | 2/2013 | Poddar | H01F 17/0013 336/84 C |
| 2013/0082812 | A1* | 4/2013 | Yoo | H01F 41/046 336/200 |
| 2014/0252533 | A1* | 9/2014 | O'Sullivan | H01L 23/3114 257/506 |
| 2015/0069572 | A1* | 3/2015 | Khanolkar | H01L 23/645 257/531 |
| 2015/0108603 | A1* | 4/2015 | Yen | H01L 23/5225 257/531 |
| 2015/0115402 | A1* | 4/2015 | Yen | H01L 27/0694 257/531 |

OTHER PUBLICATIONS

Bang, D.H., and J.Y. Park. "Ni—Zn Ferrite Screen Printed Power Inductors for Compact DC-DC Power Converter Applications." vol. 45, No. 6, Jun. 2009, IEEE Transactions on Magnetics: 2762-65.
Hurley, W.G, M.C. Duffy, S. O'Reilly, and S.C. O'Mathuna. "Impedance Formulas for Planar Magnetic Structures with Spiral Windings." vol. 46, No. 2, Apr. 2009, IEEE Transactions on Industrial Electronics: 271-78.
Lu, Junwei, and F. Dawson. "Characterizations of High Frequency Planar Transformer With a Novel Comb-Shaped Shield." vol. 47, No. 10, Oct. 2011, IEEE Transactions on Magnetics: 4493-496.
Liu, X., and S.Y. R. Hui. "An Analysis of a Double-layer Electromagnetic Shield for a Universal Contactless Battery Charging Platform." IEEE 36th Conference on Power Electronics Specialists, 2005, pp. 1767-1772.
Ouyang, Z. and M. Andersen "Overview of Planar Magnetic Technology—Fundamental Properties." vol. 29, No. 9, Sep. 2014, IEEE Transactions on Power Electronics: 4888-4900.
Roshen, W.A. "Analysis of Planar Sandwich Inductors by Current Images." vol. 26, No. 5, Sep. 1990, IEEE Transactions on Magnetics: 2880-87.
Tang, S.C., S. Y. Ron Hui and H. Shu-Hung Chung. "A Low-Profile Power Converter Using Printed-Circuit Board (PCB) Power Transformer with Ferrite Polymer Composite." vol. 16, No. 4, Jul. 2001, IEEE Transactions on Power Electronics: 493-98.
Tang, S.C., S. Y. Ron Hui, and H. Shu-Hung Chung. "Evaluation of the Shielding Effects on Printed-Circuit-Board Transformers Using Ferrite Plates and Copper Sheets." vol. 17, No. 6, Nov. 2002, IEEE Transactions on Power Electronics: 1080-88.
Chen, Baoxing et al., "High Speed Digital Isolators Using Microscale On-Chip Transformers", 72203-12709274, Non-Patent Literature, May 18, 2010 (Year 2010).
Office Action for Chinese Patent Application No. 201611173617.9, dated Jul. 14, 2020, 10 pages.
CN103187393A, English Machine Translation, 25 pages.

* cited by examiner

METHODS AND APPARATUS FOR ISOLATION BARRIER WITH INTEGRATED MAGNETICS FOR HIGH POWER MODULES

CROSS-REFERENCE TO RELATED APPLICATION

This application is a continuation of U.S. patent application Ser. No. 14/974,901 filed Dec. 18, 2015, the entirety of which is incorporated herein by reference.

BACKGROUND

This relates generally to galvanic isolation between circuits, and more particularly to an integrated circuit approach to galvanic isolation utilizing magnetic materials to further reduce the size.

Galvanic isolation between electrical systems is an increasingly needed feature that has become of more importance in modern industrial equipment along with the proliferation of inexpensive, low voltage microprocessor system used to control higher voltage systems. There are various existing elements that can isolate the systems electrically but that still allow coupling. Those elements may include a transformer to couple circuits magnetically, an RF signal to couple through a radiated energy, an opto-isolator using light energy or a capacitor using an electric field to couple circuits having differing operating voltages.

Although opto-isolators are a good solution for low speed communication, they are inefficient in DC to DC power transfer cases. Transformers are very efficient for use in DC to DC applications, but traditional transformers are expensive because of the winding structures and the amount of board space and package height consumed. Printed transformers, such as those printed on a PCB (Printed Circuit Board) exhibit some improvements in cost and repeatability over a wound transformer, however, these transformers use a large footprint on the circuit board and can also suffer degradation due to moisture or other contaminant absorption over time, resulting in higher leakages and lowered break down isolation capability. Additionally, it is desirable to design a transformer integrated into a package compatible form, so that it could be placed by traditional package assembly equipment and would have an additional layer of protection from external contaminants. In addition it is desired to arrange the integrated transformer in a manner to boost efficiency and minimize losses while operating along with co-integrated circuits in an integrated package.

U.S. Patent Application Publication No. 2015/0069572, entitled "Multilayer High Voltage Isolation Barrier in an Integrated Circuit," to Khanolkar et. al., published Mar. 12, 2015, which is co-owned with the present application and which is hereby incorporated by reference in its entirety herein, describes creating a galvanically isolated integrated circuit. In the above-referenced published patent application, an integrated circuit transformer is described herein that can be fabricated and assembled into an integrated circuit package to help alleviate some of the constraints and limitations of the traditional wound transformers, and addressing some of the limitations of conventional printed PCB transformers.

FIG. 1 depicts in a circuit schematic 100A and block diagram 100B a simple power supply with an isolation transformer. The simple example power supply of FIG. 1 has an input voltage Vin numbered 102 input to an oscillation circuit 120, an isolation transformer 110 and an output rectification circuit 130 producing an output voltage Vout numbered 104. The output circuit, called a tank circuit, also has an inductor 112. The power supply of FIG. 1 is a DC-DC converter circuit where the input circuit 120 oscillates with the input voltage Vin so that voltage can be transmitted through isolation transformer 110. The output voltage Vout, coupled through the transformer 110, is rectified by the output circuit 130. A block diagram 100B of this power supply is shown with Vin 102 feeding into the primary side oscillator circuit 120 which is coupled to an isolation transformer 110. The secondary side of the transformer winding is coupled to the rectification circuit 130 which produces the Vout 104. The power supply circuit of FIG. 1 features galvanic isolation via the transformer 110 so that the voltage and current domains on each side of the transformer are independent. In the above-referenced published patent application US 2015/0069572, this circuit example is described as being miniaturized into an integrated circuit package. The miniaturization is achieved primarily by creating a multilayer laminate isolation core on which the transformer 110 and tank coil 112 are fabricated. Separate components comprising the input circuit 120 and the output circuit 130 were then mounted in the same integrated circuit package as the transformer laminate. An integrated power supply circuit containing the laminate transformer is much less expensive than a power supply fabricated using traditional wound transformers. The resulting package takes up less board space, and it can be placed with common pick and place assembly equipment; all those factors lead to a lower cost, smaller product, which is desirable.

FIG. 2 depicts in a top view an integrated two layer air-core planar spiral transformer (a transformer laminate) 200. The term "air-core" used here refers to the manner in which the windings are constructed. In this arrangement, the magnetic field path is not influenced by any magnetic material around the transformer. In 200, a conventional transformer laminate as described in U.S. Patent Application Publication No. 2015/0069572 referenced above is shown having an air-core transformer 210 and a printed coil 212, both as corresponding to like elements as seen in the circuit diagram in FIG. 1 and numbered as isolation transformer 110 and coil 112.

A cross section of transformer laminate 200 is oriented horizontally as shown by line 3-3' with an illustration in FIG. 3.

In FIG. 3, illustrating the cross section of laminate 200, the primary and secondary coils numbered 310, 312 are shown in a vertically stacked arrangement to allow for the most direct magnetic coupling. The coils 310, 312 can be formed, for example of copper conductive material, or other electrically conductive material. For high voltage isolation, the core 319 and prepreg layers 315, 317, 321, 323, of the laminate 200 can be made from high pressure bismaleimide triazine (BT) laminates, for example. BT is noted for its high voltage breakdown strength and is available as a common semiconductor and electronics industry material that is used in copper clad laminates, circuit boards, and prepregs. Prepreg is a common industry term for a reinforcing laminate layer which has been pre-impregnated with a resin, usually epoxy resin. The prepreg material used for layers 315, 317, 321 and 323 over each side of core 319 in FIG. 3 includes curing agents and is ready to use without additional resin. Curing of the prepreg is accomplished by a combination of heat and pressure as prescribed by the manufacturer.

FIG. 4 depicts in a top view a prior art package lead frame 450 for use with the isolation laminate described above. In FIG. 4, the lead frame 450 has dashed lines that indicate the general mounting position 452 for the transformer laminate

200 depicted in FIG. 2. A circuit die attach pad area is provided for an input circuit at position 460 and a second die attach pad area is provided for an output circuit 462 which, in combination with the transformer laminate 200 and with encapsulation (not shown in FIG. 4), can be used to create a packaged, integrated galvanic isolation circuit. In the lead frame 450 of FIG. 4, a void 454 is shown in the die attach pad area 452 that is to be located under the transformer laminate. This void 454 is utilized to allow the magnetic flux lines of the transformer laminate to circulate more freely and efficiently. Although this void 454 improves the coupling of the coils, it also limits the amount of heat that can be transferred from a package formed using the lead frame 450. In addition, the input and output circuit locations, 460 and 462, may be subject to high levels of EMI (Electro-Magnetic Interference) from the magnetic flux of the transformer laminate when it is used on the lead frame 450.

FIG. 5 depicts in an orthographic projection features of a prior art integrated power supply integrated circuit 501 utilizing a transformer laminate for providing isolation. In FIG. 5, a lead frame 550 similar to the lead frame 450 in FIG. 4 holds an input circuit 520, a transformer laminate 500 with an isolation transformer 510 and an output circuit 530. These components are used for forming a simple power supply with galvanic isolation as diagramed in FIG. 1. Coil 512 on laminate 500 serves as the tank inductor such as is shown as 112 in the circuit diagram in FIG. 1. With the addition of encapsulation (not shown), these components can form an integrated power supply in an IC package utilizing a laminated transformer 500. The integration achieves a packaged power supply, for example, having significant size and cost advantages over non-integrated solutions.

Continuing improvements are therefore needed for methods and apparatus for integrated devices including improved isolation between circuit components to improve efficiency, increase power handling capacity, improve thermal conduction, and to reduce EMI.

SUMMARY

Arrangements of this description overcome the deficiencies of the conventional solutions for isolation in integrated power circuits. In the arrangements, magnetic material is provided on either side of an isolation laminate including transformer coils. The magnetic material is configured to shape magnetic flux for increased performance and enhanced thermal b conductivity for the transformer which provides galvanic isolation between two circuits.

In an example arrangement, an apparatus includes an isolation laminate that further includes a dielectric core having a first surface and a second surface opposed to the first surface; at least one conductive layer configured as a first transformer coil overlying the first surface; a first dielectric layer surrounding the at least one conductive layer; a first magnetic layer overlying the at least one conductive layer; at least one additional conductive layer configured as a second transformer coil overlying the second surface; a second dielectric layer surrounding the at least one additional conductive layer; and a second magnetic layer overlying the at least one additional conductive layer.

In a further arrangement, in the above-described apparatus, the isolation laminate further includes a conductive layer forming at least one EMI shield overlying one of the first surface and the second surface of the dielectric core; and a dielectric material surrounding the EMI shield and insulating the at least one EMI shield from the first transformer coil and the second transformer coil.

In another example arrangement, a packaged integrated circuit includes a leadframe having first and second portions for placing a first semiconductor circuit and a second semiconductor circuit; and an isolation laminate mounted on a third portion of the leadframe and isolated from at least one of the first portion and the second portion, including a dielectric core having a first surface and a second surface opposed to the first surface; at least one conductive layer configured as a first transformer coil overlying the first surface; a first dielectric layer surrounding the at least one conductive layer; a first magnetic layer overlying the at least one conductive layer; at least one additional conductive layer configured as a second transformer coil overlying the second surface; a second dielectric layer surrounding the at least one additional conductive layer; and a second magnetic layer overlying the at least one additional conductive layer.

In a further arrangement, the above-described packaged integrated circuit further includes a first circuit disposed on the first portion of the leadframe and coupled to the first transformer coil; and a second circuit disposed on the second portion of the leadframe and coupled to the second transformer coil; wherein the first circuit and the second circuit are galvanically isolated from one another and signals from the first circuit are coupled to the second circuit by the first and second transformer coils.

In still another arrangement, a method includes providing a dielectric core material having a first surface and a second surface opposing the first surface; forming in a first conductive layer a first transformer coil overlying the first surface of the dielectric core; forming a first dielectric layer surrounding the first conductive layer; forming a first magnetic layer overlying the first transformer coil; forming in a second conductive layer a second transformer coil overlying the second surface of the dielectric core; forming a second dielectric layer surrounding the second transformer coil; and forming a second magnetic layer overlying the second transformer coil.

This description enables integrated circuits having isolation between circuits coupled using transformer coils, while having increased thermal conductivity, reduced EMI, higher power capability and reduced losses.

DETAILED DESCRIPTION OF EXAMPLE EMBODIMENTS

Figure 1:
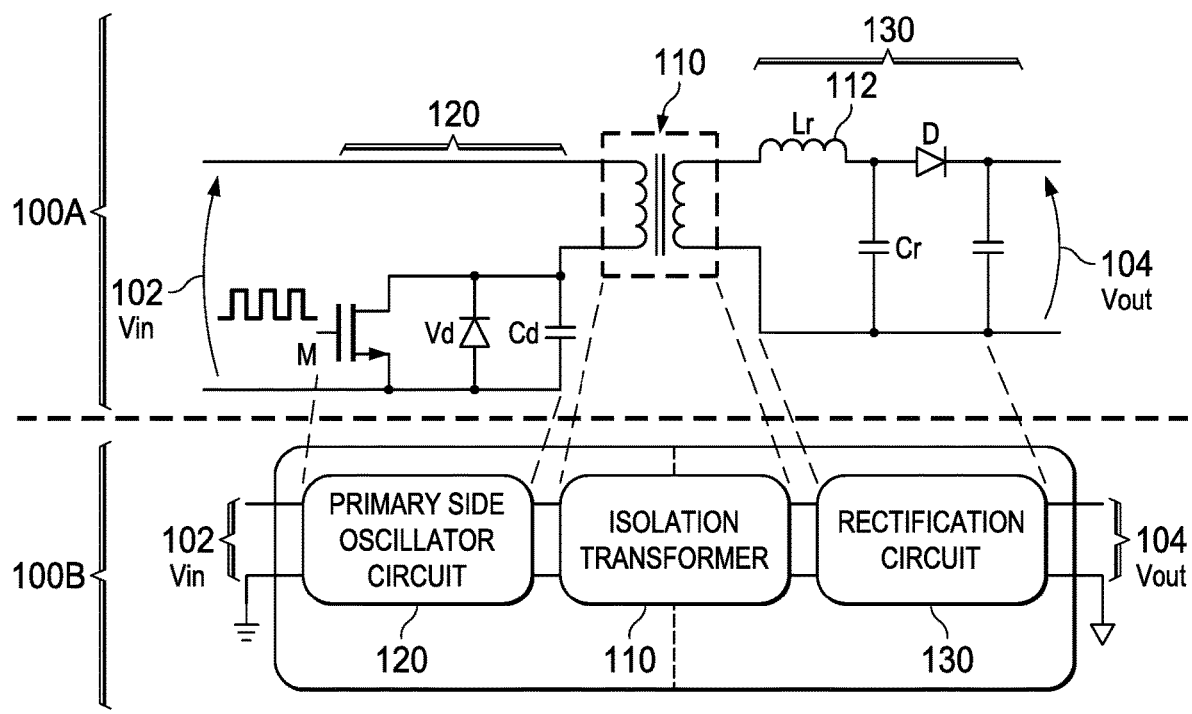
FIG. 1 depicts a circuit schematic and a block diagram of an approach for a simple power supply with an isolation transformer.
Figure 2:
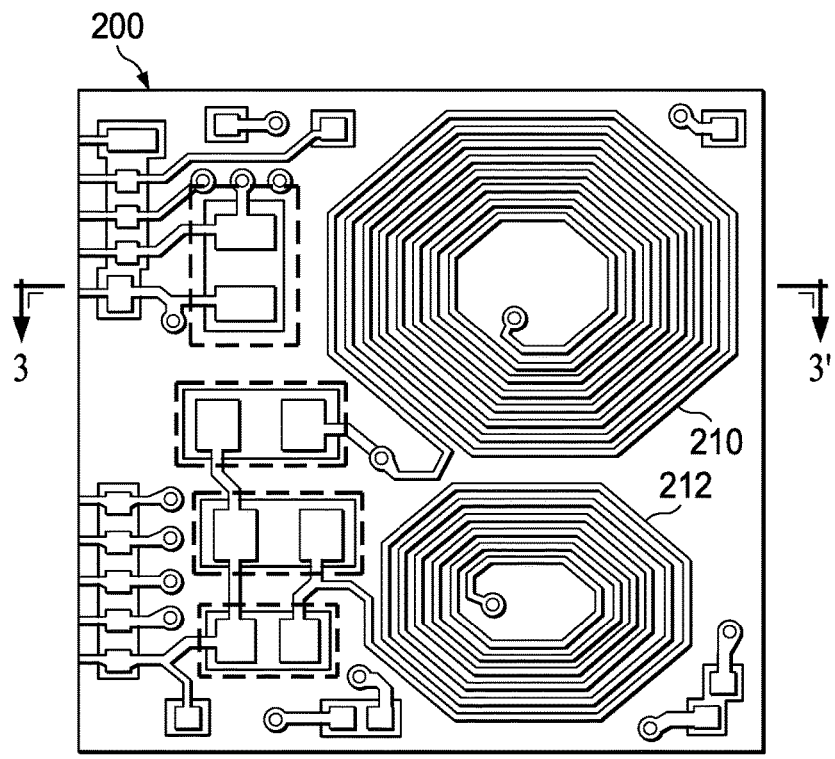
FIG. 2 depicts in a top view an isolation laminate with an integrated two layer air-core planar spiral transformer.

Corresponding numerals and symbols in the drawings generally refer to corresponding parts unless otherwise indicated. The drawings are drawn to clearly illustrate the relevant aspects of the illustrative example arrangements and are not necessarily drawn to scale.

The making and using of various illustrative example arrangements that incorporate aspects of this description are discussed in detail below. The illustrative examples can be embodied in a wide variety of specific contexts. The specific examples and arrangements discussed are merely illustrative of specific ways to make and use the various arrangements, and the examples described do not limit the scope of this description.

For example, when the term "coupled" is used herein to describe the relationships between elements, the term as used in this description is to be interpreted broadly, and while the term "coupled" includes "connected," the term "coupled" is not to be limited to "connected" or "directly connected" but instead the term "coupled" may include connections made with intervening elements, and additional elements and various connections may be used between any elements that are described as "coupled."

In the field of magnetics, flux lines can be redirected and focused using various materials. The available materials for confining the flux include ferromagnetic materials, ferrite or ferrimagnetic materials, other materials can include zinc (Zn), nickel (Ni), manganese (Mn), and the like. Various materials that have a permeability of greater than 1 can be used. Magnetic metals in general can include, for example, materials that contain iron, nickel or cobalt. Ferrite magnetic materials can include ceramic materials. In arrangements that form aspects of this description, the arrangements improve on the prior art isolation techniques by using magnetic materials to create magnetic layers on at least the top and bottom faces of a transformer laminate. The magnetic material layers underneath and on top of the transformer laminate enclose, confine and focus the magnetic flux between the layers, changing an air-core transformer to a magnetic-core transformer while still fitting into a small, integrated package. Utilizing an arrangement of the current application, a magnetic layer is applied to the bottom face of the transformer laminate. The magnetic material redirects the and confines the flux lines above the lead frame die attach pad, thus eliminating the need in prior art approaches for a void in the lead frame die attach pad placed under the transformer laminate. The result is an improved ability in the arrangements of this description to conduct thermal energy from the transformer laminate to the package lead frame, this in turn leads to an improved power handling capability for the transformer laminate and hence the ability to create higher power modules.

In addition to the above-described arrangement, in additional alternative arrangements a second magnetic layer is located on the top face of the transformer laminate and creates an upper magnetic shield. The upper magnetic layer works in conjunction with the bottom layer of magnetic material to encapsulate and focus the flux lines between the two magnetic layers which cover the spiral coils of the transformer. This second magnetic layer reduces possible EMI infiltration from outside the package as well as containing flux from the transformer laminate so that it reduces or eliminates EMI on the adjacent circuits. In addition, as will be shown in a later graph, the magnetic layers confine and focus the flux so that the effective inductance is more than doubled. An increased effective inductance value allows the input and output switching networks to operate at a lower frequency, leading to an efficiency increase in those circuits and hence increased efficiency in the integrated power supply module overall.

The following figure illustrates the fabrication steps of an integrated power supply arrangement incorporating aspects of the current application by providing magnetic material placed within the package.

FIGS. 6A-E depict in a series of cross sectional views the fabrication of a portion of an integrated power supply with aspects of this description used for containing the magnetic flux. In an example arrangement 600, a cross section of a lead frame die attach pad and bond finger is 661 shown in FIG. 6A. An example lead frame for use with the arrangements may have a thickness in the range of 300 microns to 40 microns, although other thicknesses can also be used. Various materials known for leadframes can be used. Platings and coatings can be applied to the leadframes such as noble metals, conductors such as copper, and anti-corrosion coatings such as platinum, gold, palladium, nickel can be used. Alloys can be used.

Figure 6A:
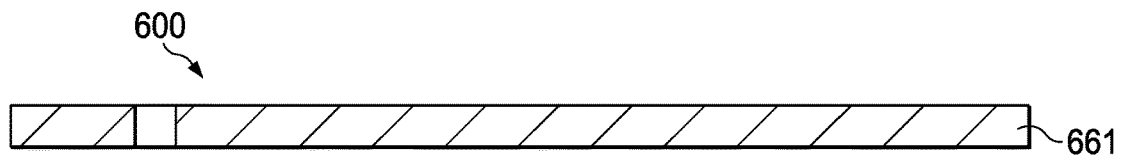
FIGS. 6A-E depict in a series of cross sectional views the fabrication steps for forming an arrangement of this description including an isolation laminate with magnetic layers surrounding the isolation laminate.
Figure 6B:
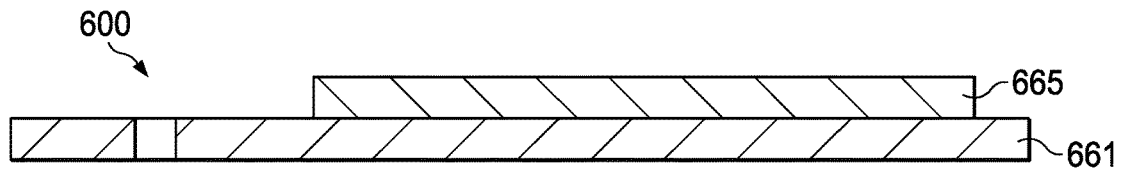

In FIG. 6B, in a cross section depicting the structure 600 after a subsequent fabrication step, a magnetic material 665 having, as an example, a thickness in the range of 300 microns to 400 microns is mounted by known processes, usually by use of solder or adhesives, to the lead frame die attach pad 661. The magnetic material 665 can also be of other thicknesses as needed for a particular application. At this phase of the assembly of structure 600, other ICs (not shown), such as an input circuit or output circuit, could also be mounted to the lead frame 661. The full contact between the upper surface of the lead frame 661 and the magnetic layer 665 allows for good thermal contact and therefore enables thermal distribution through the magnetic material and the leadframe. The magnetic material 665 can vary but should have a permeability greater than about 1.

Figure 3:
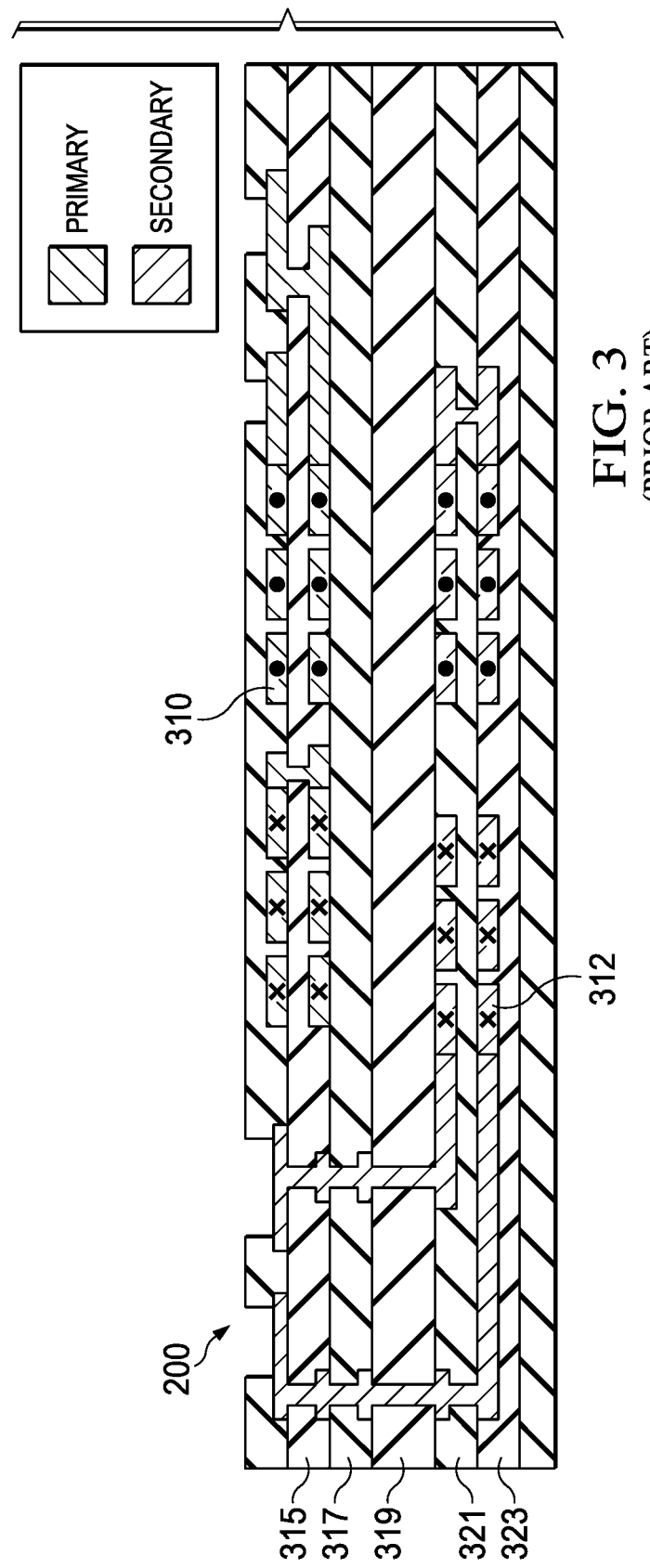
FIG. 3 depicts in a cross sectional view the isolation laminate of FIG. 2.
Figure 4:
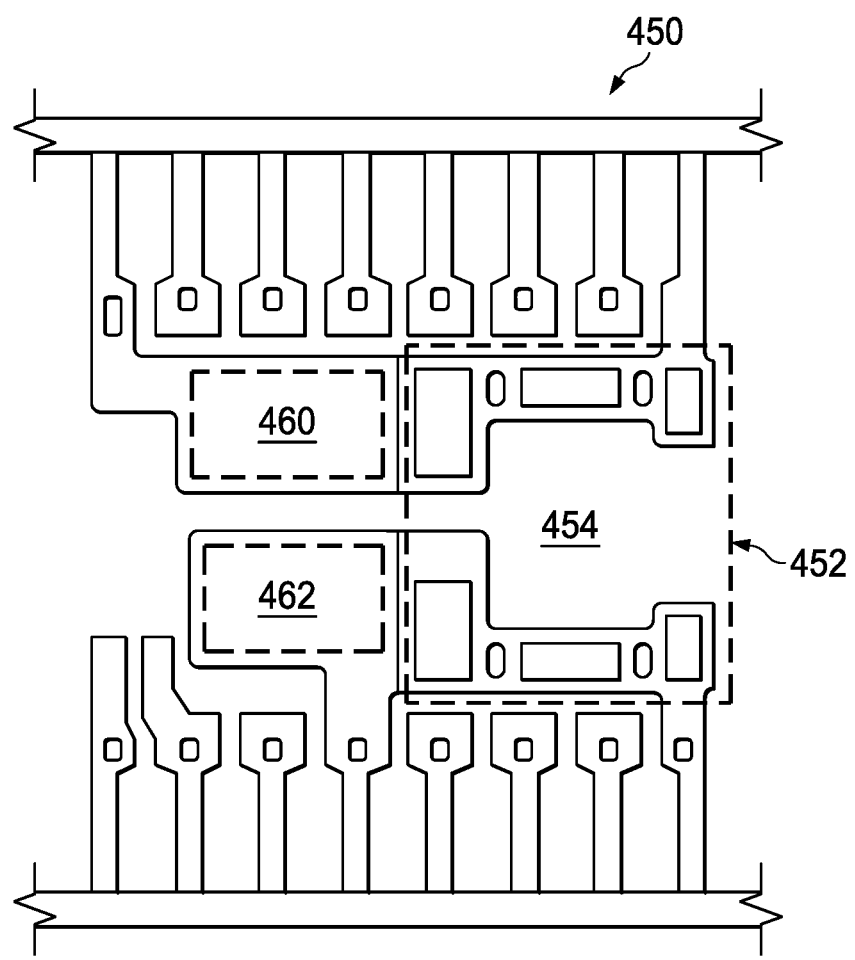
FIG. 4 depicts in a top view a lead frame for use with the isolation laminate of FIGS. 2 and 3.
Figure 5:
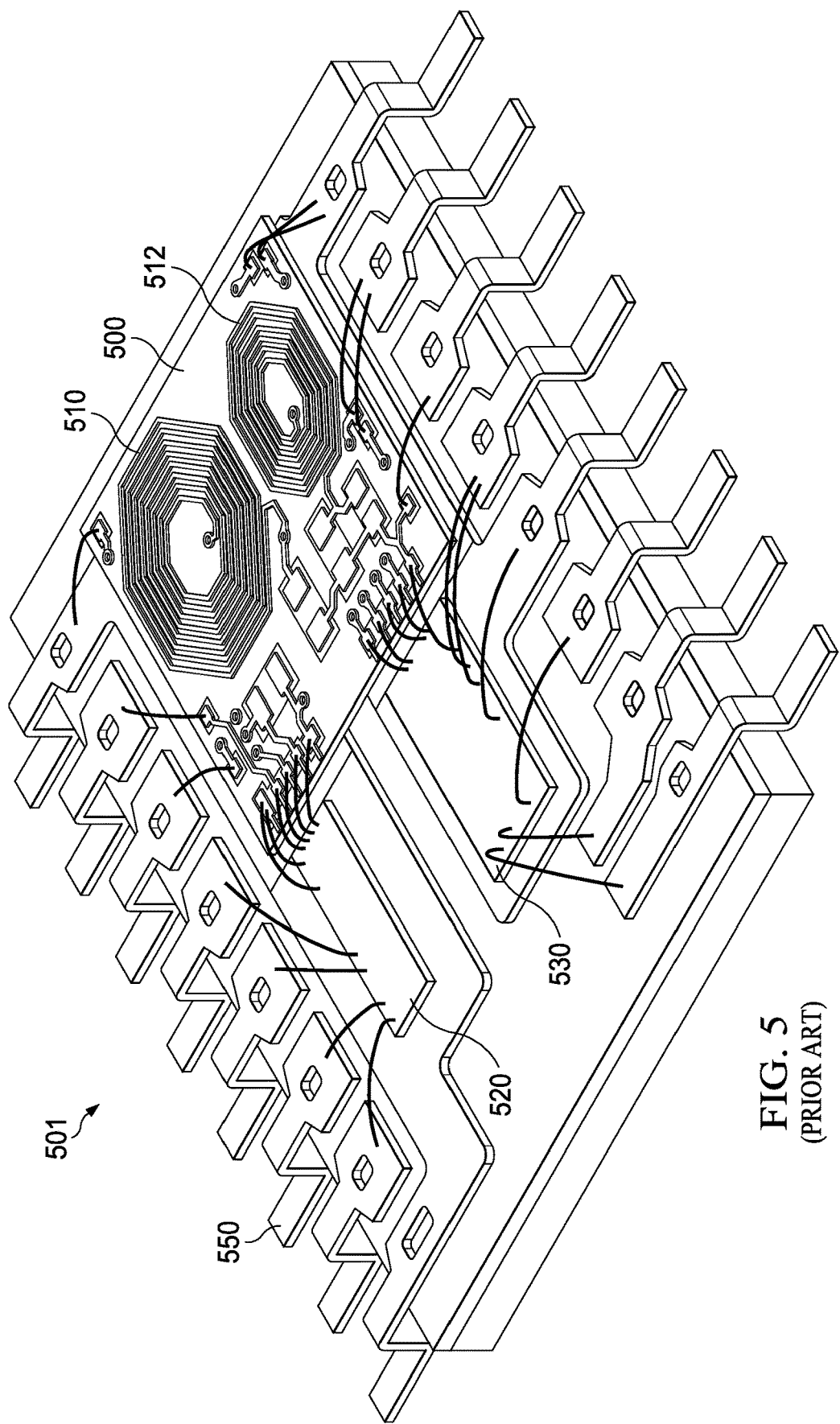
FIG. 5 depicts in an orthogonal projection a prior art integrated power supply integrated circuit utilizing a printed laminated transformer providing isolation.
Figure 6C:
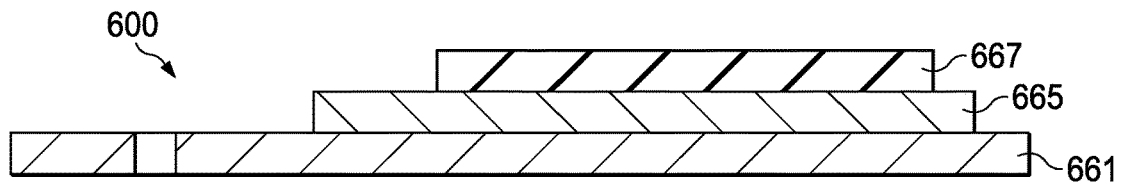

In FIG. 6C, the structure 600 is shown in another cross section after additional processing steps. In FIG. 6C, a printed transformer laminate 667, which may be similar to the isolation laminate 200 shown in cross section in FIG. 3, having for example a thickness in the range of 300 microns to 400 microns or other thicknesses, is attached to the magnetic plate 665 using known processes. The isolation laminate can have a BT resin core, and prepreg layers formed on either surface of the BT resin core, and can incorporate copper or other metal layers to form transformer coils as described above. For example, alternative conductor materials used in semiconductor processes such as, for example, aluminum can be used for the forming the coils.

Figure 6D:
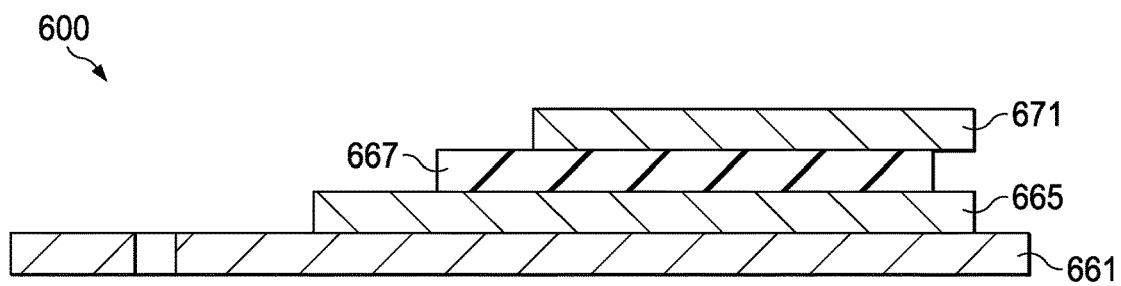

In FIG. 6D, structure 600 is again depicted in a cross sectional view following an additional processing step. FIG. 6D depicts structure 600 after the addition of the second, upper magnetic layer 671 attached to the top side of the transformer laminate 667 by known methods. The top and bottom magnetic layers 665, 671 provide conduits for enclosing, confining and focusing the magnetic flux of the coils within the isolation laminate 667.

Figure 6E:
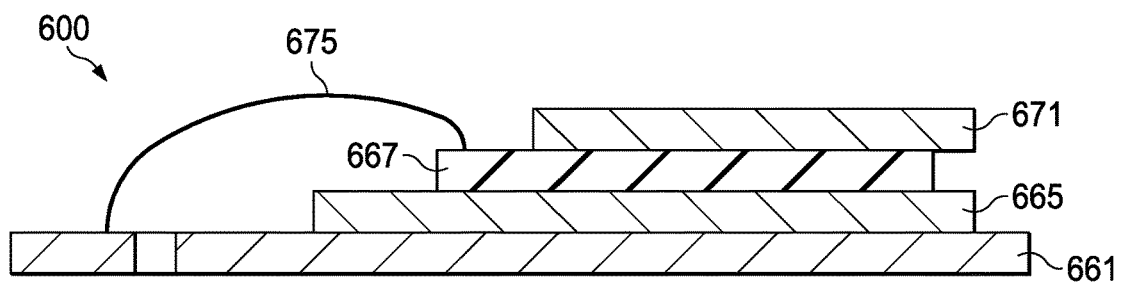

In FIG. 6E, the structure 600 is depicted in another cross section view and following additional processing steps on the layers 661, 665, and 671 described above. In FIG. 6E, the addition of bonding wires 675 to the transformer laminate 667 completes the electrical connections. Bond wires to other components may be formed at this stage of the fabrication as well.

The final step for the structure 600 (not shown in FIGS. 6A-E) is the encapsulation of the assembly in the final package form, by known processes, such as by transfer or injection molding. It is further contemplated that the transformer laminate 667 may arrive at the fabrication stage with the magnetic plates 665, 671 already in place, reducing the number of steps in this fabrication, however this contemplated alternative approach still creates the stack of encapsulating shields and transformer laminates.

The formation of the magnetic layers 665 and 671 in FIGS. 6B-6E may be accomplished by any one of several alternative approaches, each of which forms additional arrangements within the scope of this description. Materials can be used that have a permeability of about 1 or greater. In an example approach, sintering or press laminating of magnetic powders to a thickness of 100 microns to 500 microns, with the lower thickness limit being determined by the saturation level of the material and the maximum thickness being determined by the maximum package thickness allowed, is used. In another alternative approach, the magnetic material can be formed using powders and binders, and no sintering is needed. In addition, the magnetic materials can be formed in large pieces or layers and cut to size as needed. Formation of the material need not be done contemporaneously with the packaging steps. The magnetic powders that may be used include ferrite magnetic materials, and ferromagnetic materials. Ceramic materials can be used. Additional alternative materials can be used including, without limitation, magnetic tapes or plates. Commercially available magnetic powdered materials often used for the fabrication of toroid cores have been used in example arrangements, such as without limitation Ferroxcube 4F1, and Hitachi NL12S. The arrangements herein can use additional materials and are not limited to these illustrative examples. Additional alternative arrangements can be formed using ferrite materials, ferromagnetic materials, and other materials that will confine the flux. Materials with a permeability of greater than about 1 can be used. The arrangements of this description are not limited to the use of any particular magnetic material and additional alternative arrangements using other magnetic materials form additional aspects of this description, and these alternatives also fall within the scope of this description.

Figure 7A:
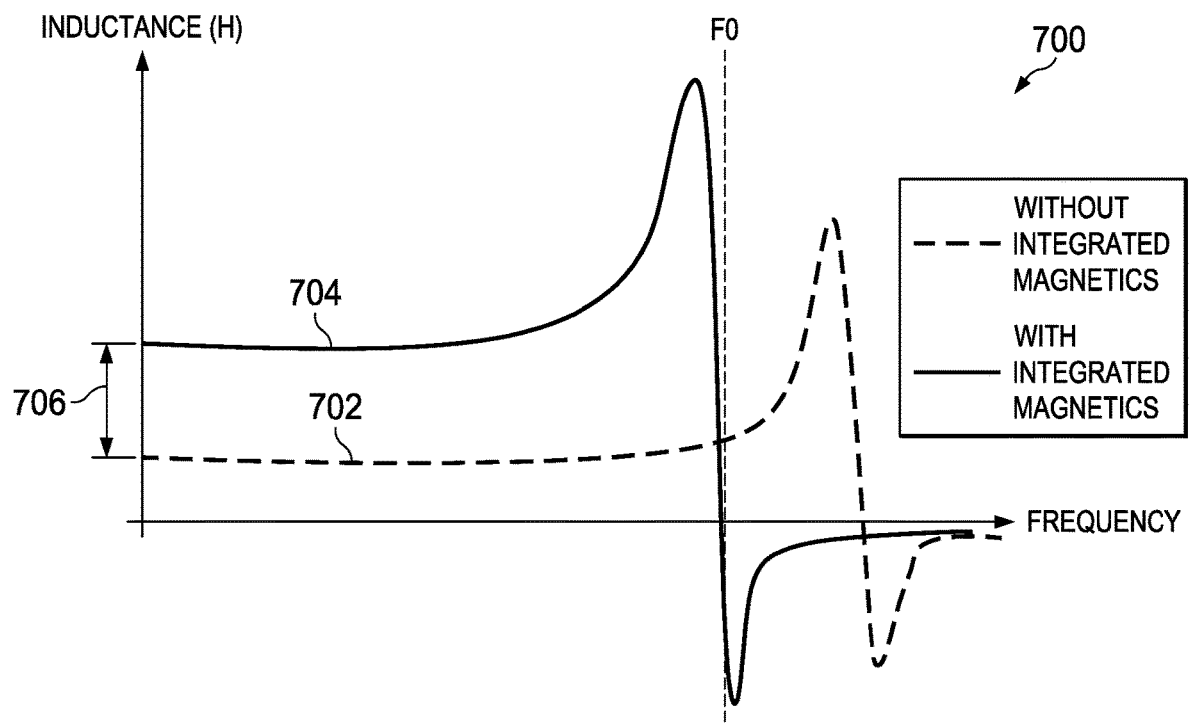
FIGS. 7A and 7B illustrate a pair of graphs showing the improvements in transformer properties accomplished due to the use of the arrangements including the magnetic layers.
Figure 7B:
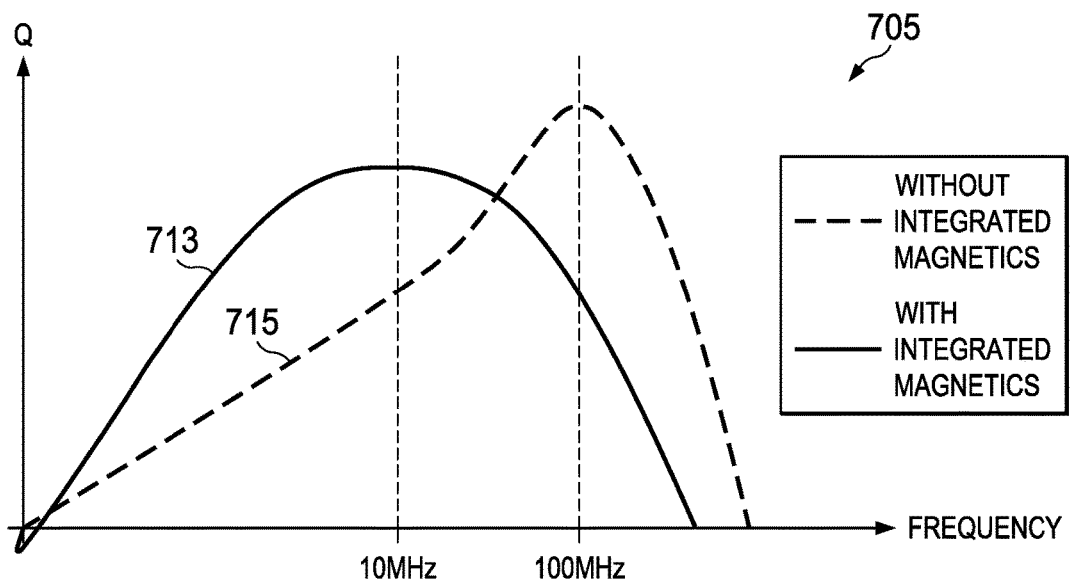

FIGS. 7A-7B illustrate a pair of graphs showing, for explanation and without presenting any raw data, the improvements achieved in the transformer properties due to the magnetic material arrangements of this description, as compared to conventional approaches. In graph 700 in FIG. 7A, the vertical axis shows increasing inductance in Henry units, and the horizontal axis shows increasing frequency in MHz. Data line 702 indicates the inductance response of a conventional approach transformer without the integrated magnetic layers of the arrangements of this description, while data line 704 indicates the inductance with the magnetic layers of the arrangements. The graph indicates that the inclusion of the magnetic materials more than doubles the inductance value 706 and reduces the frequency of optimum inductance. The zero crossing frequency F0 is lowered using the approach. This shift in frequency greatly improves the efficiency of PWM (Pulse Width Modulation) power supplies.

In FIG. 7B, in the graph 705, the vertical axis shows increasing Q (Q is the quality factor, which is the ratio of energy stored to energy loss in an inductor) factor values and the horizontal axis shows increasing frequency from left to right, in MHz. Data line 715 indicates the inductance response obtained without the integrated magnetic layers of this description, while data line 713 indicates the inductance obtained with the magnetic materials of the arrangements of this description. The graph 705 indicates that the integrated magnetic material can decrease the peak Q frequency by a full decade (from 100 MHz to 10 MHz) while simultaneously widening the peak area. Thus the use of the magnetic layers of this description greatly improves performance of the transformers.

Figure 8:
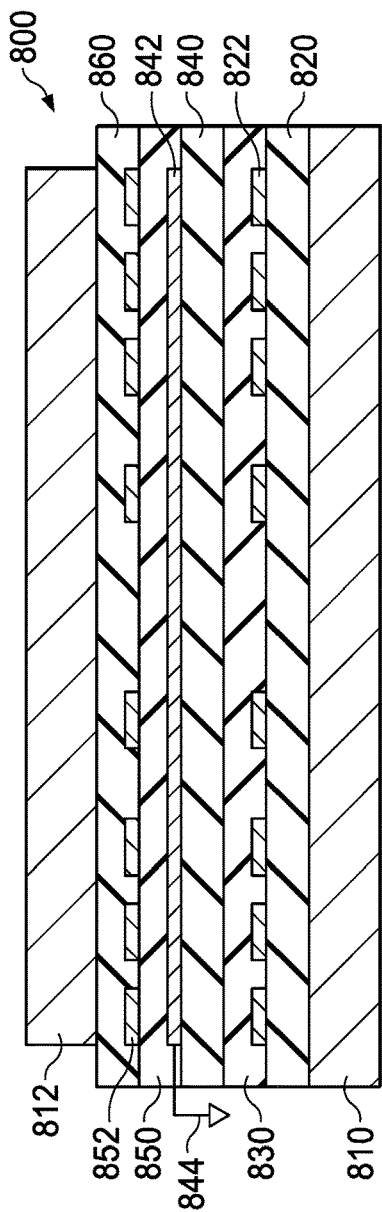
FIG. 8 depicts in a cross sectional view an arrangement including a printed circuit isolation transformer arrangement incorporating aspects of this description.

FIG. 8 depicts in another cross section a portion of a printed circuit transformer 800 that incorporates arrangements that form aspects of this description. FIG. 8 depicts a cross section of a printed circuit transformer starting with a bottom magnetic layer 810, followed by a copper clad lamination 820 with copper coils 822, lamination 820 can be a prepreg layer, for example. Note that in alternative arrangements, other conductors such as aluminum can be used in place of copper, and alloys including copper, aluminum or other materials for conductors can be used. Next, in the non-limiting example of FIG. 8, is a dielectric core 830 followed by another copper clad lamination 840 with copper layer 842. Another copper clad lamination 850 with copper 852 is then followed by lamination 860. The top layer of the transformer 800 in FIG. 8 is the upper magnetic layer 812. In the cross section of FIG. 8, the copper 822 and 852 can be formed into the primary and secondary coils of an isolation transformer, for example, as described above. The magnetic layers 810 and 812 serve to contain the magnetic flux. Copper 842 forms at least one plane that creates an integrated EMI shield connected to ground 844. The copper 842 can be a slotted plane to further suppress eddy currents. The goal of the use of the copper plane 842 is to block electric field but allow magnetic coupling between the primary and secondary sides of the transformer. In additional arrangements, at least one additional copper plane (not shown) is formed for additional EMI shielding, and this at least one additional copper plane is isolated from each of the first and second sides of the transformer and the copper plane 842.

In a conventional approach for the transformer, arranged without the magnetic layers of the arrangements of this description, and using the air core dielectric of a printed circuit transformer, the limiting factors include that placing the copper plane 842 as an EMI shield requires larger separation between the primary and secondary coils of the transformer, which results in reduced coupling between the coils, and this reduced coupling further reduces efficiency and power transfer between the coils So in a conventional approach, use of the EMI shield 842 would reduce the coupling between the coils 852 and 822 and therefore reduce performance.

In sharp contrast to the conventional approaches, with the inclusion of the magnetic layers 812 and 810 in the structure shown in FIG. 8, the magnetic flux is more focused, providing good coupling between the transformer coils even with a larger separation between the coils. Because the magnetic layer 810 on the bottom of the structure allows for placement of the isolation transformer 800 in full contact on a die attach pad without a void, excellent thermal transfer can be achieved, further increasing performance. The thermal energy can be conducted into and transported out of the package by the leadframe that the magnetic layer 810 is placed in contact with. Further the upper layer of magnetic material can be used to increase thermal transfer, for example a thermal slug or other thermally conductive material such as a thermal pad can be placed in contact with the upper layer 812 and thereby provide additional thermal dissipation from a packaged device.

In an alternative arrangement, an additional EMI shield (not shown in FIG. 8) can be used to further increase the performance of the arrangements. Use of two or more EMI shields placed between the upper layer of magnetic material and the lower layer of magnetic material forms additional arrangements that are also contemplated as forming aspects of this description, and which fall within the scope of this description.

Figure 9:
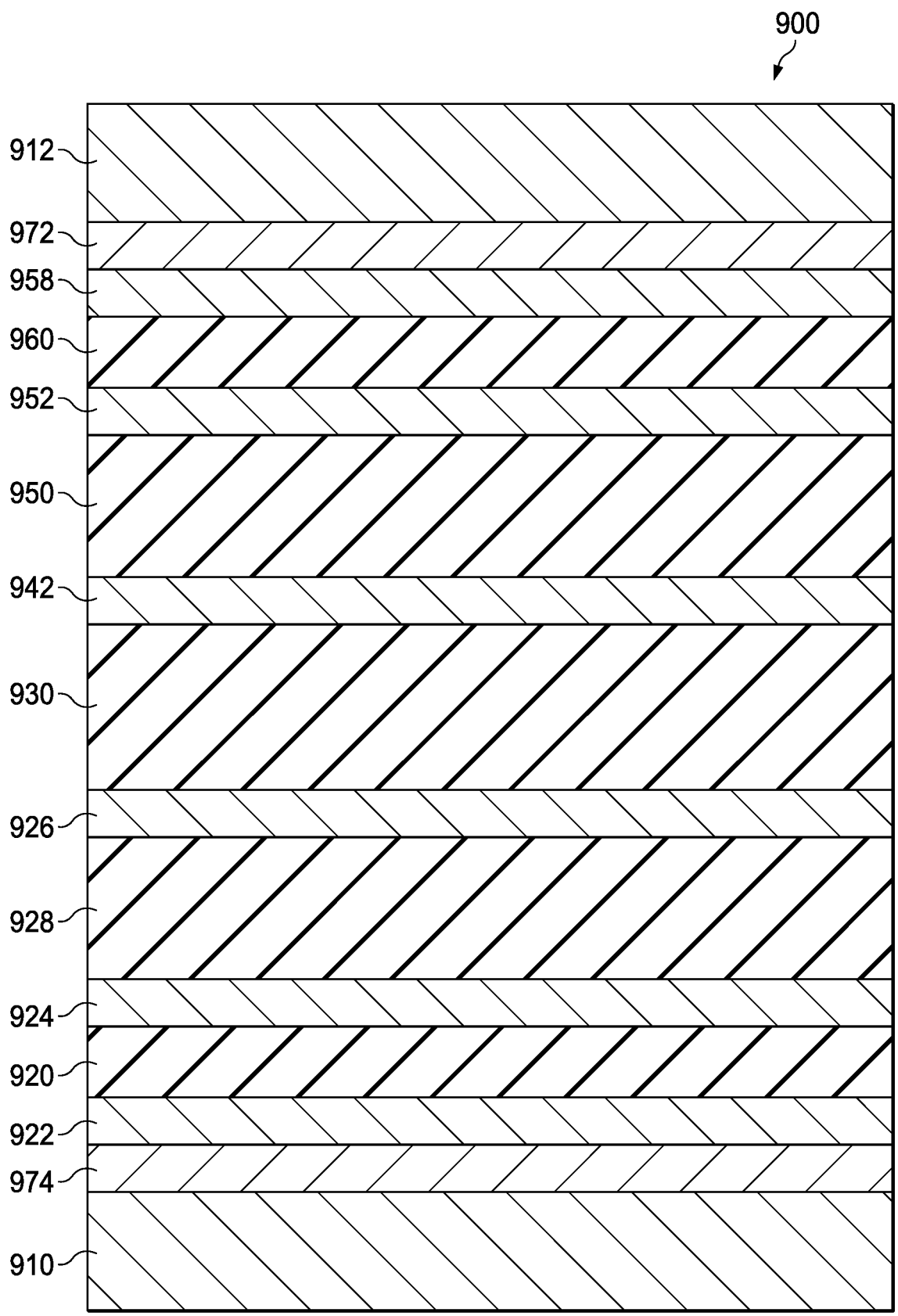
FIG. 9 depicts in another cross sectional view details of an additional arrangement for an isolation transformer of this description.

FIG. 9 depicts in a cross sectional view a laminate structure 900 illustrating further details of a non-limiting example arrangement that can be incorporated into isolation structures and circuits. In this non-limiting example, a dielectric core 930, which corresponds to the core layer 830 in the previous figure, and which has in a non-limiting example a thickness of about 60 microns, can be formed of BT resin, for example. A set of layers of prepreg material and metal layers are shown arranged on both sides of the core 930. For example metal layer 942 is formed on an upper surface of the core 930 and can be, in this non-limiting example, about 25 microns thick. Other thicknesses can be used to form additional alternatives. The metal can be any conductor but may be, for example formed of copper or copper alloys or aluminum. Additional layers above the core 930 include prepreg layer 950 and another metal layer 952, followed by another prepreg layer 960 and copper layer 958. A soldermask layer 972 overlies and protects the upper surface of metal layer 958. The upper magnetic layer 912 is then shown disposed over the soldermask 972. In an example arrangement the upper magnetic layer can be of about 300 microns thick, however, in alterative arrangements, the upper magnetic layer can be of other thicknesses.

Continuing to describe the example arrangement of FIG. 9, layers formed starting on the bottom surface of core 930 include, for example, a series of metal layers including 926, 924, 922 separated by prepreg layers 928, 920, and finally a soldermask layer 974 is disposed beneath the bottom surface of the bottom metal layer 922. The metal layers in this non-limiting, illustrative example include copper metal layers of thickness of about 25 microns. The prepreg layers can have various thicknesses, for example between or including 45 microns and 55 microns. The soldermask layer can be about 50 microns in this example although more, and less, thicknesses can be used to form additional alternative arrangements.

Bottom magnetic layer 910 is shown disposed on the bottom surface of the soldermask 974 and is about 300 microns thick in this illustrative example. Use of the magnetic materials in the arrangements contain and control the flux from the transformer coils formed in the metal layers, increasing performance and reducing EMI in circuits positioned near the transformer. The use of the magnetic layers allows for increased thermal performance due to the ability to position the magnetic material in direct contact with die pad attach material on a leadframe, to allow for efficient thermal transfers.

While FIG. 9 depicts an example arrangement that forms an aspect of this description, the arrangements and this description is not limited to the examples shown, and alternatives with different materials, different thicknesses, and more or fewer layers can be used to form additional arrangements that are also contemplated as forming additional aspects of this description and which fall within the scope of this description.

Figure 10:
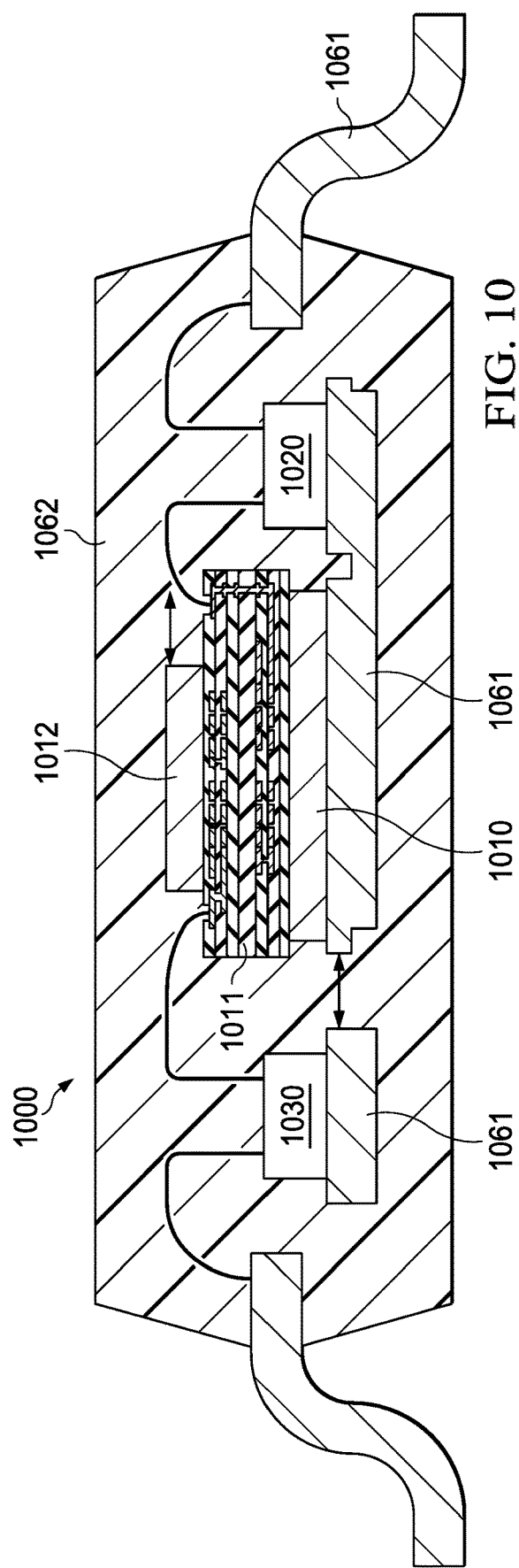
FIG. 10 depicts in a cross sectional view a packaged integrated circuit arrangement incorporating the isolation laminate and magnetic layers of this description.

FIG. 10 depicts in a cross sectional view a packaged integrated circuit 1000 including the magnetic layers and isolation transformers of the arrangements in an example application. In FIG. 10, a first integrated circuit die 1020 may include, for example, circuitry for a primary side circuit in a power supply. The integrated circuit die 1020 can be positioned on a die attach pad on a leadframe 1061. An isolation structure 1011 includes a magnetic layer 1010 on the bottom surface and an upper magnetic layer 1012 over the laminated isolation structure. The isolation structure 1011 is disposed on and in thermal contact with a second die attach pad on the leadframe 1061. In an alternative arrangement, however, the isolation structure 1011 could be placed on a portion of the leadframe with the secondary circuit 1030. A secondary circuit is formed in a second integrated circuit die 1030 that is disposed on a separate portion of the leadframe 1061 and is electrically isolated from the transformer portion. The leadframe 1061 and the components including the primary integrated circuit die 1020, the secondary integrated circuit die 1030, and the isolation structure 1011, are all encapsulated by molding compound 1062. The completed packaged integrated circuit is shown, in this non-limiting example, in a Small Outline Integrated Circuit (SOIC) package, however other package types used in the semiconductor industry can also be used with the arrangements. The arrangements are formed with the purpose of providing efficient and highly integrated power transfers through an isolation barrier. The apparatus and methods of this description can be used for various applications such as power supplies, sensors, driver integrated circuits, indicators, control panels, and the like, and the use of the arrangements in these applications form additional aspects of this description.

In an example arrangement, an apparatus includes an isolation laminate including a dielectric core having a first surface and a second surface opposed to the first surface; at least one conductive layer configured as a first transformer coil overlying the first surface; a first dielectric layer surrounding the at least one conductive layer; a first magnetic layer overlying the at least one conductive layer; at least one additional conductive layer configured as a second transformer coil overlying the second surface; a second dielectric layer surrounding the at least one additional conductive layer; and a second magnetic layer overlying the at least one additional conductive layer.

In a further example arrangement, in the apparatus described above, further including a conductive layer forming at least one EMI shield overlying one of the first surface and the second surface of the dielectric core; and a dielectric material surrounding the EMI shield and insulating the EMI shield from the first transformer coil and the second transformer coil.

In yet another example arrangement, the above-described apparatus further includes a leadframe having a die attach pad; and the isolation laminate disposed upon the die attach pad and in thermal contact with the die attach pad through one of the first and second magnetic layers.

In still another arrangement, the above-described apparatus further includes wherein the dielectric core further includes BT resin. In a further arrangement, in the above-described apparatus, the first dielectric layer further includes prepreg material. In still another arrangement, in the above-described apparatus, the first and second magnetic layers are formed from powdered magnetic material in a sintering operation.

In still another further arrangement, in the above-described apparatus wherein the powdered magnetic material includes ferrite material. In yet another arrangement, in the above-described apparatus, the first magnetic layer further includes metal-based magnetic material. In another further arrangement, in the above-described apparatus, the first magnetic layer further includes nickel and/or zinc material. In still another arrangement, in the above-described apparatus, the at least one conductive layer further includes copper or copper alloy.

In another example arrangement, a packaged integrated circuit includes a leadframe having first and second portions for placing a first semiconductor circuit and a second semiconductor circuit; and an isolation laminate mounted on a third portion of the leadframe and isolated from at least one of the first portion and the second portion, further including a dielectric core having a first surface and a second surface opposed to the first surface; at least one conductive layer configured as a first transformer coil overlying the first surface; a first dielectric layer surrounding the at least one conductive layer; a first magnetic layer overlying the at least one conductive layer; at least one additional conductive layer configured as a second transformer coil overlying the second surface; a second dielectric layer surrounding the at least one additional conductive layer; and a second magnetic layer overlying the at least one additional conductive layer.

In still another example arrangement, the above-described packaged integrated circuit further includes a first circuit disposed on the first portion of the leadframe and coupled to the first transformer coil; and a second circuit disposed on the second portion of the leadframe and coupled to the second transformer coil; wherein the first circuit and the second circuit are galvanically isolated from one another and signals from the first circuit are coupled to the second circuit by the first and second transformer coils.

In yet another example arrangement, in the above-described packaged integrated circuit the isolation laminate further includes a conductive layer forming at least one EMI shield overlying one of the first surface and the second surface of the dielectric core; and a dielectric material surrounding the at least one EMI shield and insulating the at least one EMI shield from the first transformer coil and the second transformer coil.

In still a further example arrangement, in the above-described packaged integrated circuit the dielectric core further includes BT resin. In another example arrangement, in the above-described packaged integrated circuit, the first magnetic layer includes ferrite material.

In yet another example arrangement, in the above-described packaged integrated circuit, the first magnetic layer further includes metal-based magnetic material. In still another example arrangement, in the above-described packaged integrated circuit, further including encapsulation material surrounding the leadframe and the isolation laminate.

In another example arrangement, a method includes providing a dielectric core material having a first surface and a second surface opposing the first surface; forming in a first conductive layer a first transformer coil overlying the first surface of the dielectric core; forming a first dielectric layer surrounding the first conductive layer; forming a first magnetic layer overlying the first transformer coil; forming in a second conductive layer a second transformer coil overlying the second surface of the dielectric core; forming a second dielectric layer surrounding the second transformer coil; and forming a second magnetic layer overlying the second transformer coil.

In still another example arrangement, in the above-described method, the method includes forming the first magnetic layer by sintering a powdered magnetic material. In yet another example arrangement, in the above-described method, forming the first magnetic layer further includes forming a layer from ferrite material.

Various modifications can also be made in the order of steps and in the number of steps to form additional arrangements that incorporate aspects of this description, and these modifications will form additional alternative arrangements that fall within the scope of this description.

The scope of this description is not limited to the particular illustrative example arrangement of the process, machine, manufacture, and composition of matter means, methods and steps described in this specification. Processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, this description includes within its scope such processes, machines, manufacture, compositions of matter, means, methods, or steps.

What is claimed is:

1. An apparatus comprising:
an isolation laminate comprising:
    a dielectric core having opposite first and second surfaces;
    a first conductive layer over the first surface, the first conductive layer including a first transformer coil;
    a first dielectric layer on the first conductive layer;
    a first magnetic layer over the first conductive layer;
    a second conductive layer over the second surface, the second conductive layer including a second transformer coil;
    a second dielectric layer on the second conductive layer;
    a second magnetic layer over the second conductive layer; and
    a third conductive layer over the first surface, the third conductive layer including an electromagnetic interference (EMI) shield.

2. The apparatus of claim 1, further comprising:
a dielectric material on the EMI shield and between the EMI shield and the first transformer coil.

3. The apparatus of claim 1, further comprising:
a leadframe having a die attach pad, wherein
the isolation laminate is in thermal contact with the die attach pad through the first magnetic layer or the second magnetic layer.

4. The apparatus of claim 1, wherein the dielectric core comprises a bismaleimide triazine resin.

5. The apparatus of claim 1, wherein the first dielectric layer, the second dielectric layer, or both comprises a prepreg material.

6. The apparatus of claim 1, wherein the first and second magnetic layers are formed from a powdered magnetic material and formed using a sintering operation.

7. The apparatus of claim 6, wherein the powdered magnetic material comprises a ferrite material.

8. The apparatus of claim 1, wherein the first magnetic layer, the second magnetic layer, or both comprises a magnetic material having a permeability of greater than about 1.

9. The apparatus of claim 1, wherein the first magnetic layer, the second magnetic layer, or both comprises a ferrous material.

10. The apparatus of claim 1, wherein the first magnetic layer, the second magnetic layer, or both comprises one of:
nickel; or
zinc; or
nickel and zinc.

11. The apparatus of claim 1, wherein the at first, second, and third conductive layers each comprises one of:
copper; or
another electrical conductor.

12. A packaged integrated circuit comprising:
a leadframe having an isolation laminate die attach pad and first and second circuit die attach pads, wherein the isolation laminate die attach pad is isolated from the first circuit die attach pad; and
an isolation laminate coupled to the isolation die attach pad, the isolation laminate comprising:
a dielectric core having opposite first and second surfaces;
a first conductive layer over the first surface, the first conductive layer including a first transformer coil;
a first dielectric layer on the first conductive layer;
a first magnetic layer over the first conductive layer;
a second conductive layer over the second surface, the second conductive layer including a second transformer coil;
a second dielectric layer on the second conductive layer; and
a second magnetic layer over the second conductive layer; and
a third conductive layer over the first surface, the third conductive layer including an electromagnetic interference (EMI) shield.

13. The packaged integrated circuit of claim 12, further comprising:
a first circuit coupled to the first circuit die attach pad and coupled to the first transformer coil; and
a second circuit coupled to the second circuit die attach pad and coupled to the second transformer coil;
wherein the first circuit and the second circuit are galvanically isolated using the isolation laminate.

14. The packaged integrated circuit of claim 12, wherein the isolation laminate further comprises:
a dielectric material on the EMI shield and between the EMI shield and the first transformer coil.

15. The packaged integrated circuit of claim 14, wherein the EMI shield is a first EMI shield, wherein the dielectric material is a first dielectric material, and wherein the isolation laminate further comprises:
a fourth conductive layer over the second surface, the fourth conductive layer including a second EMI shield; and
a second dielectric material on the second EMI shield and between the second EMI shield and the second transformer.

16. The packaged integrated circuit of claim 12, wherein the first magnetic layer, the second magnetic layer, or both comprises a magnetic material having a permeability of greater than about 1.

17. The packaged integrated circuit of claim 12, wherein the first magnetic layer, the second magnetic layer, or both comprises one of a ferrite material or a metal-based magnetic material.

18. The packaged integrated circuit of claim 12, further comprising an encapsulation material around the leadframe and the isolation laminate.

19. A method, comprising:
forming a first conductive layer of a first surface of a dielectric core material having the first surface and an opposite second surface;
forming a first transformer coil in the first conductive layer;
forming a first dielectric layer on the first conductive layer;
forming a first magnetic layer over the first transformer coil;
forming a second conductive layer over the second surface;
forming a second transformer coil in the second surface;
forming a second dielectric layer on the second transformer coil;
forming a second magnetic layer over the second transformer coil; and
forming an electromagnetic interference shield over the first surface.

20. The method of claim 19, wherein forming the first magnetic layer comprises sintering a magnetic powdered material.

* * * * *